United States Patent
Nagasue

(10) Patent No.: US 6,940,344 B2
(45) Date of Patent: Sep. 6, 2005

(54) D-CLASS SIGNAL AMPLIFICATION CIRCUIT

(75) Inventor: Makoto Nagasue, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 66 days.

(21) Appl. No.: 10/747,235

(22) Filed: Dec. 30, 2003

(65) Prior Publication Data

US 2005/0052229 A1 Mar. 10, 2005

(30) Foreign Application Priority Data

Sep. 10, 2003 (JP) .................................... 2003-317831

(51) Int. Cl.$^7$ ............................................... H03F 3/38
(52) U.S. Cl. ........................... 330/10; 330/251; 330/51
(58) Field of Search ............................ 330/10, 51, 251

(56) References Cited

U.S. PATENT DOCUMENTS

| | | | |
|---|---|---|---|
| 6,191,653 B1 * | 2/2001 | Camp et al. ................ | 330/129 |
| 6,218,897 B1 * | 4/2001 | Barzegar et al. ............ | 330/51 |
| 6,590,940 B1 * | 7/2003 | Camp et al. ................ | 375/297 |
| 6,693,571 B2 * | 2/2004 | Melanson et al. .......... | 341/143 |
| 6,774,725 B2 * | 8/2004 | Miki et al. .................. | 330/297 |

FOREIGN PATENT DOCUMENTS

JP          2002-536903          10/2002

* cited by examiner

*Primary Examiner*—Patricia Nguyen
(74) *Attorney, Agent, or Firm*—Rabin & Berdo, P.C.

(57) ABSTRACT

A D-class signal amplification circuit of the invention intends to repress the influence by a fluctuations of the power supply voltage with a simplified circuit construction and inexpensive components. The D-class signal amplification circuit includes: a multiplier that multiplies an input signal by a correction coefficient, a first modulator that executes a delta-sigma modulation to an output signal from the multiplier, a D-class amplifier supplied with a power supply voltage VDD, which amplifies an output signal from the first modulator, a voltage conversion circuit that generates a power supply voltage VDD/2 from the power supply voltage VDD, a first low pass filter that inputs a signal converted into a level of VDD/2 on the basis of the output signal outputted from the D-class amplifier, a reference signal generation circuit supplied with VDD/2, which generates a reference signal on the basis of the input signal, a second low pass filter that inputs the reference signal, a first comparator that compares levels of the signals outputted from the first with the second low pass filters, and a coefficient control circuit that increases or decreases the correction coefficient by a predetermined modifying breadth, on the basis of the comparison result.

13 Claims, 13 Drawing Sheets

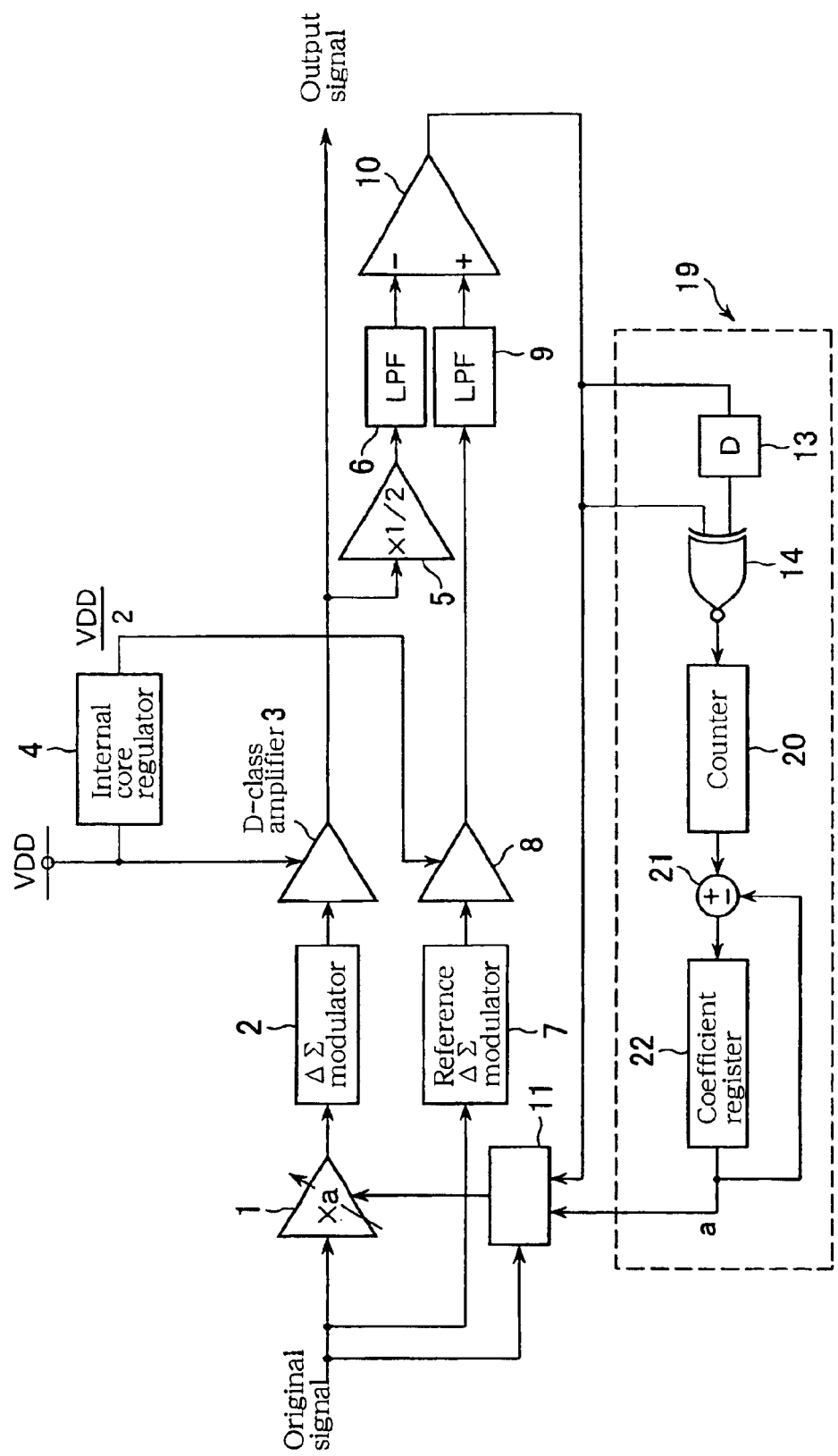

FIG. 7

| Processing sequence (nth time) | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|
| Output of comparator | H | L | H | L | H | H | H | H | L | H | L | L | L | L | H | L | H |
| Absolute value of modifying breadth of coefficient $\Delta$ | $\Delta a$ | $\Delta a$ | $\Delta a$ | $\Delta a$ | $\Delta a$ | $2\Delta a$ | $3\Delta a$ | $4\Delta a$ | $3\Delta a$ | $2\Delta a$ | $\Delta a$ | $2\Delta a$ | $3\Delta a$ | $4\Delta a$ | $3\Delta a$ | $2\Delta a$ | $a$ |
| Coefficient | $+a$ | 0 | $+a$ | 0 | $+a$ | $+3a$ | $+6a$ | $+10a$ | $+7a$ | $+9a$ | $+8a$ | $+6a$ | $+3a$ | $-a$ | $+2a$ | 0 | $+a$ |

US 6,940,344 B2

D-CLASS SIGNAL AMPLIFICATION CIRCUIT

BACKGROUND OF THE INVENTION

1. Field of the Invention

The present invention relates to a D-class signal amplification circuit that amplifies a power of an input signal of an audio regenerative signal and so forth.

This application is counterpart of Japanese patent application, Ser. No. 317831/2003, filed Sep. 10, 2003, the subject matter of which is incorporated herein by reference.

2. Description of the Related Art

A conventional audio signal-reproducing unit includes a delta-sigma modulator as a D/A conversion circuit and a D-class amplifier composed of a CMOS inverter. This type of audio signal-reproducing unit converts the input signal (original signal) being a multi-bit digital signal into one-bit analog signal by means of the delta-sigma modulator, and amplifies this analog signal by means of the D-class amplifier to drive a speaker, etc.

Since an AB-class power amplifier uses an operational amplifier, the amplifier is able to eliminate the fluctuations of a power supply voltage. However, the D-class amplifier composed of a CMOS inverter transfers the power supply voltage to an output side directly, accordingly the amplifier cannot eliminate the fluctuations of the power supply voltage at all. Therefore, to realize a satisfactory sound quality requires an extremely high precision in the power supply voltage of the D-class amplifier. To achieve such a power supply voltage requires a large capacitor and inductor, which is a hindrance to reduce the circuit area and the production cost.

The patent document, i.e. JP-A 2000-536903 (page 11–25, FIG. 2–FIG. 12) discloses an example of the b-class amplifier having a construction that reduces an influence by the fluctuations of the power supply voltage. This D-class amplifier detects an absolute value of noises contained in the output signal, calculates a digital correction signal on the basis of this absolute value, multiplies the input signal by this correction signal, and thereby restrains the influence by the fluctuations of the power supply voltage.

The D-class amplifier disclosed in JP-A 2000-536903 calculates the digital correction signal by use of the absolute value of noises contained in the output signal, which requires a complicated arithmetic operation. The amplifier requires an analog/digital converter (ADC) and so forth to generate the digital correction signal from the analog signal, which complicates the circuit construction and involves an apprehension of the cost increase.

SUMMARY OF THE INVENTION

The present invention has been made in view of the above problems, and an object of the invention is to provide a D-class signal amplification circuit that represses the influence by the fluctuations of the power supply voltage with a simplified construction and inexpensive components.

The D-class signal amplification circuit relating to the invention is supplied with a first power supply voltage, amplifies an input signal inputted to an input node to output an output signal to an output node, and includes: a multiplier, a first modulator, a D-class amplifier, a voltage conversion circuit, a first low pass filter, a reference signal generation circuit, a second low pass filter, a first comparator, and a coefficient control circuit.

The multiplier multiplies the input signal by a correction coefficient. The first modulator executes a delta-sigma modulation to an output signal from the multiplier. The D-class amplifier is supplied with the first power supply voltage, and amplifies an output signal from the first modulator to output the output signal to the output node. The voltage conversion circuit generates a second power supply voltage lower than the first power supply voltage, retained at a constant level from the first power supply voltage. The first low pass filter inputs a signal converted into a level of the second power supply voltage on the basis of the output signal outputted from the D-class amplifier. The reference signal generation circuit is supplied with the second power supply voltage, and generates a reference signal for comparing a signal outputted from the first low pass filter on the basis of the input signal. The second low pass filter inputs the reference signal. The first comparator compares a level of the signal outputted from the first low pass filter with a level of the signal outputted from the second low pass filter. The coefficient control circuit increases or decreases the correction coefficient being multiplied by the multiplier by a predetermined modifying breadth, on the basis of a comparison result of the first comparator.

The D-class signal amplification circuit relating to the invention generates the second power supply voltage from the first power supply voltage being the supply voltage to the D-class amplifier. The second power supply voltage is lower than the first power supply voltage, and is retained to a constant level, that is, second power supply voltage is substantially immune to the fluctuations of the first power supply voltage. And, the signal in which the output signal from the D-class amplifier is converted into a level of the second power supply voltage and the reference signal generated by the reference signal generation circuit supplied with the second power supply voltage are passed through the first and the second low pass filters, and thereafter the two signals are compared; and on the basis of the comparison result, the correction coefficient is increased or decreased.

Concretely, when the first power supply voltage decreases, since the level of the signal in which the output signal from the D-class amplifier is converted into the level of the second power supply voltage becomes lower than the level of the reference signal, the correction coefficient is increased; in reverse, when the first power supply voltage increases, the correction coefficient is decreased. That is, the comparison result of the following two signals is fed back: the signal based on the output signal from the D-class amplifier, being affected by the fluctuations of the first power supply voltage, and the reference signal substantially immune to the fluctuations of the first power supply voltage; and the correction coefficient multiplied to the input signal is increased or decreased by the predetermined modifying breadth, thus repressing the influence by the fluctuations of the first power supply voltage supplied to the D-class amplifier, with the above simple control and simplified construction.

The D-class signal amplification circuit according to the invention is able to repress the influence by the fluctuations of the power supply voltage with a simple control and a simplified construction such that the comparison result of the output signal and the reference signal is fed back, and the correction coefficient multiplied to the input signal is increased or decreased by the predetermined modifying breadth.

BRIEF DESCRIPTION OF THE DRAWINGS

FIG. 2 illustrates a D-class signal amplification circuit when a delta-sigma modulator is shared with;

FIG. 3 illustrates a relation between the determination as to whether a waveform level is high or low against the waveform center and the correction of a coefficient a;

FIG. 6 illustrates a D-class signal amplification circuit relating to the fourth embodiment;

FIG. 7 illustrates an example of a modifying breadth Δ of the correction coefficient a;

FIG. 12 illustrates a D-class signal amplification circuit when a comparator is shared with.

DETAILED DESCRIPTION OF THE PREFERRED EMBODIMENTS (1) First Embodiment

[Construction]

Figure 1:
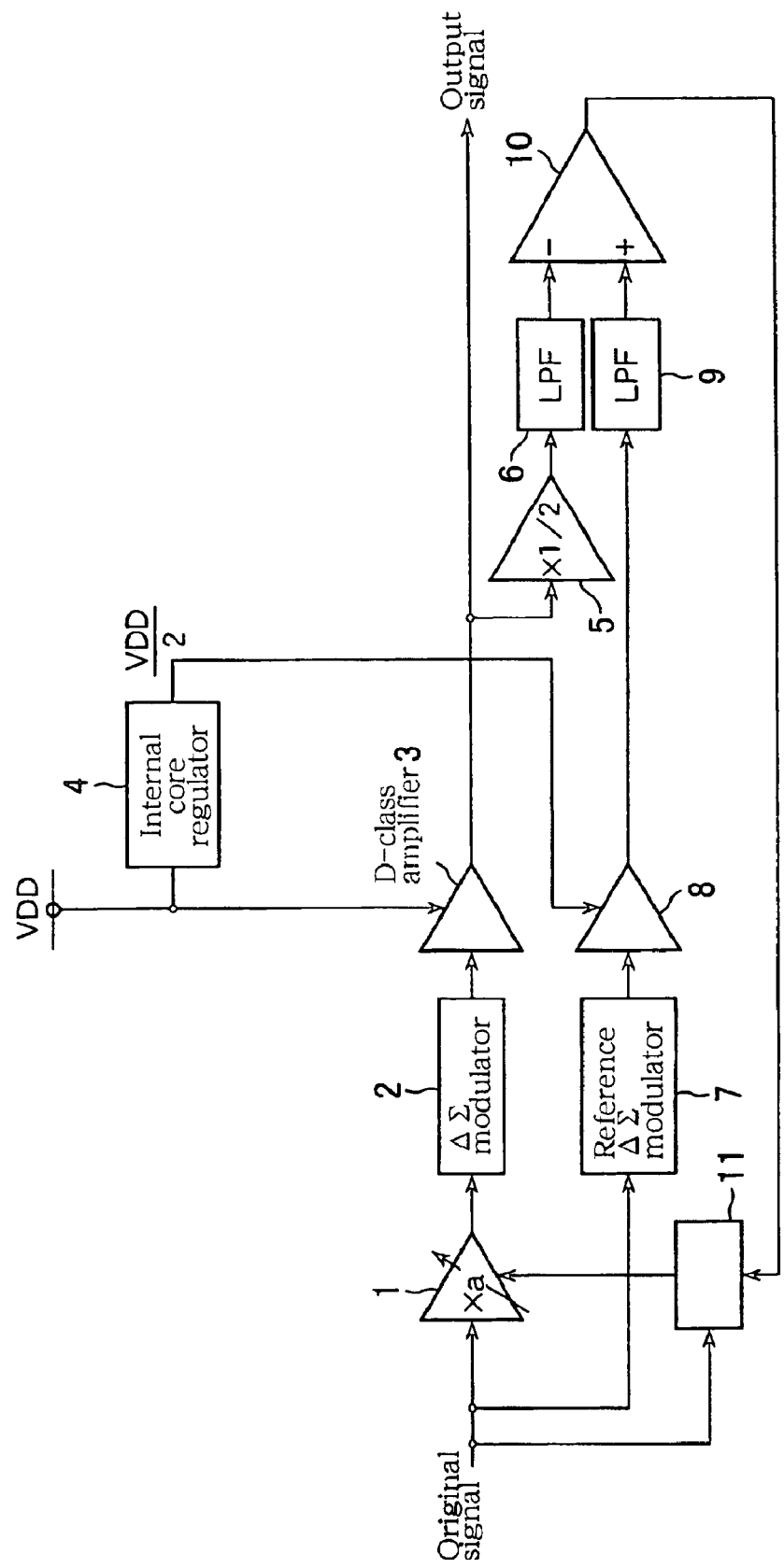
FIG. 1 illustrates a D-class signal amplification circuit relating to the first embodiment.

FIG. 1 illustrates a D-class signal amplification circuit relating to the first embodiment of the invention. This D-class signal amplification circuit is provided with a function that corrects the fluctuations of the power supply voltage through a feedback loop. Here, the D-class signal amplification circuit will be described with an example, which is used in the output stage of an audio signal-reproducing unit, and drives a sound-reproducing unit such as a speaker.

In FIG. 1, an original signal as an input signal inputted to an input node is a multi-bit digital audio signal (for example 16 bits). A multiplier 1 multiplies the original signal by a correction coefficient a to thereby adjust a gain thereof. A delta-sigma modulator 2 as the first delta-sigma modulation circuit executes a delta-sigma modulation to the signal that the multiplier 1 has multiplied the original signal being a 16-bit digital signal by the correction coefficient a, and converts the result into one-bit analog signal. The delta-sigma modulation is the technique that subtracts an output signal before one sampling from the input signal, and quantizes an integrated value thereof to thereby realize a high-precision (high S/N ratio) D/A conversion with a low bit (low resolution). This is based on a principle that integrates errors by quantization, namely, feeds back the quantization errors through a low pass filter, thereby applies greater feedbacks to lower frequency components of the errors, and drives away the quantization noises to higher frequencies, which is generally called the noise shaping. By means of this principle, the output signal from the delta-sigma modulator 2 includes the input signal and the quantization noises whose components are dislocated to a higher frequency range. Therefore, only passing this output signal through a low-degree low pass filter, the delta-sigma modulation will produce the input signal with a high S/N ratio, while using one bit.

A D-class amplifier 3 represents an inversion circuit composed of a CMOS inverter, to which is supplied a first power supply voltage VDD, executes a D-class signal amplification to the analog signal of one bit being the output signal from the delta-sigma modulator 2, and outputs an output signal to an output node. An internal core regulator 4 as the power supply voltage conversion circuit represents a DC-DC converter composed of, for example, a switching circuit, and generates a second power supply voltage VDD/2 (regulator voltage) retained lower than the first power supply voltage VDD from the first power supply voltage VDD. The regulator voltage VDD/2 is lower than the power supply voltage VDD, and is stabilized without working together with the fluctuations of the power supply voltage VDD. Here, although the regulator voltage is set to VDD/2 being half the power supply voltage VDD, as long as it is a voltage lower than the minimum value by the fluctuations of the power supply voltage VDD, it is not restricted to VDD/2. The internal core regulator 4 is always prepared as the internal core power supply, when manufacturing the LSI conforming to the specification as a single power supply input by use of a fine pattern process. This embodiment employs the regulator for this internal core power supply.

A reference delta-sigma modulator 7 represents a delta-sigma modulator that applies the delta-sigma modulation to the original signal. The reference delta-sigma modulator 7 assumes the same construction as the delta-sigma modulator 2, whereas it is provided separately from the delta-sigma modulator 2. An internal buffer 8 assumes the same construction as the D-class amplifier 3, to which is supplied the regulator voltage VDD/2, and converts the output signal from the reference delta-sigma modulator 7 to generate a reference signal. That is, the internal buffer 8 supplied with the regulator voltage VDD/2 substantially immune to the fluctuations of the power supply voltage VDD converts the one-bit analog signal having the delta-sigma modulation applied to the original signal itself, and thereby generates the reference signal that is not affected by the fluctuations of the power supply voltage VDD, and is proportional to the output signal from the D-class amplifier 3. A multiplier 5 outputs a signal in which the output signal from the D-class amplifier 3 is converted into a level of the regulator voltage VDD/2. Concretely, the multiplier 5 divides the level of the output signal from the D-class amplifier 3 into ½. A low pass filter 6 as the first low pass filter inputs an output signal after divided, and removes undesired high frequency components from the output signal after divided to produce a pure signal component. A low pass filter 9 as the second low pass filter inputs the reference signal after divided, and removes undesired high frequency components from the reference signal to produce a pure signal component. Here, the reference delta-sigma modulator 7 and the internal buffer 8 make up a reference signal generation circuit that generates the reference signal for comparing the output signal from the low pass filter 6 with the original signal. The reference delta-sigma modulator 7 corresponds to the second delta-sigma modulation circuit.

A comparator 10 compares the waveform levels of the output signal after divided having undesired high frequency components eliminated by the low pass filter 6 with the reference signal having undesired high frequency components eliminated by the low pass filter 9; if the output signal after divided is higher than the reference signal, the comparator 10 outputs Low, and if the output signal after divided is lower than the reference signal, the comparator 10 outputs High. A coefficient control circuit 11 determines whether the waveform level of the original signal is higher or lower than the waveform center, and increases or decreases the correction coefficient a of the multiplier 1 by a constant modifying breadth Δa, on the basis of the determination result and the output from the comparator 10.

[Operation]

The feedback correction control of the power supply voltage fluctuations in the above D-class signal amplification circuit will be described. The output signal amplified by the D-class amplifier 3 supplied with the power supply voltage VDD, being outputted to a speaker, etc., is divided into ½ by the multiplier 5; thereafter, the output signal, having the undesired high frequency components eliminated by the low pass filter 6, is inputted to the comparator 10. On the other hand, the reference signal converted by the internal buffer 8 supplied with the regulator voltage VDD/2 that is substantially immune to the fluctuations of the power supply voltage VDD, having the undesired high frequency components thereof eliminated by the low pass filter 9, is inputted to the comparator 10. The comparator 10 compares the output signal after divided with the reference signal, and outputs Low or High in correspondence with the comparison result.

The coefficient control circuit 11 decreases the correction coefficient a by the constant modifying breadth Δa, if the amplitude of the output signal after divided (hereunder, simply referred to as output signal) is higher than that of the reference signal; reversely, if the amplitude of the output signal is lower than that of the reference signal, it increases the correction coefficient a by the constant modifying breadth Δa. The amplitude comparison of the output signal and the reference signal is executed on the basis of the determination as to whether the waveform level of the original signal is higher or lower than the waveform center, and the determination as to the magnitude of the waveform levels of the output signal and the reference signal.

Figure 3:
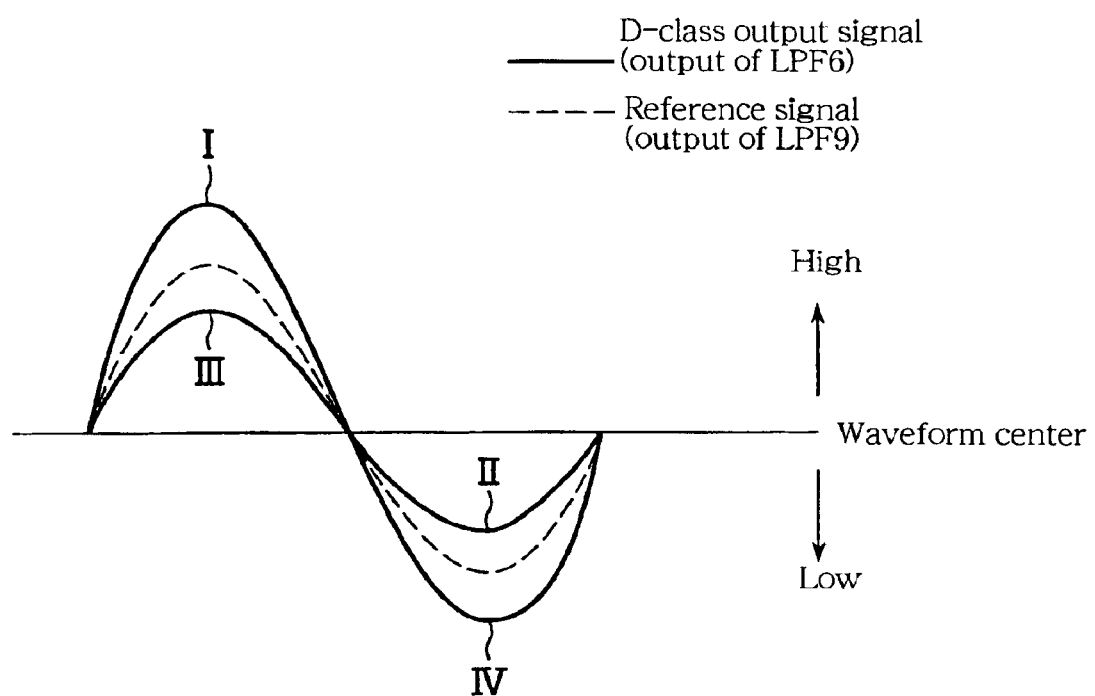

As shown by the curve I in FIG. 3, when the output from the comparator 10 is Low and the waveform level of the original signal is higher than the waveform center, the power supply voltage VDD is in the state of fluctuating to the higher voltage side, and the amplitude of the output signal is higher than that of the reference signal; accordingly, the coefficient control circuit 11 decreases the correction coefficient a by the constant modifying breadth Δa. On the other hand, as shown by the curve II in FIG. 3, when the output from the comparator 10 is Low and the waveform level of the original signal is lower than the waveform center, the power supply voltage VDD is in the state of fluctuating to the lower voltage side, and although the waveform level of the output signal is higher than that of the reference signal, the amplitude of the output signal is lower than that of the reference signal; accordingly, the coefficient control circuit 11 increases the correction coefficient a by the constant modifying breadth Δa.

As shown by the curve III in FIG. 3, when the output from the comparator 10 is High and the waveform level of the original signal is higher than the waveform center, the power supply voltage VDD is in the state of fluctuating to the lower voltage side, and the amplitude of the output signal is lower than that of the reference signal; accordingly, the coefficient control circuit 11 increases the correction coefficient a by the constant modifying breadth Δa. On the other hand, as shown by the curve IV in FIG. 3, when the output from the comparator 10 is High and the waveform level of the original signal is lower than the waveform center, the power supply voltage VDD is in the state of fluctuating to the higher voltage side, and although the waveform level of the output signal is lower than that of the reference signal, the amplitude of the output signal is higher than that of the reference signal; accordingly, the coefficient control circuit 11 decreases the correction coefficient a by the constant modifying breadth Δa.

As mentioned above, the correction by the feedback of the correction coefficient a using a specified sampling frequency optimizes the correction coefficient a so as to make the output signal equal to the reference signal; thereby, it is possible to repress the influence by the fluctuations of the power supply voltage VDD. In the concrete, when the power supply voltage VDD fluctuates to VDD+ΔV, the dc component and signal frequency components of the output signal at the D-class amplifier 3 are varied to those without the fluctuations multiplied by (VDD+ΔV)VDD. With regard to this, when the correction coefficient a being multiplied to the original signal is corrected through the feedback according to the variation of the output signal, the correction coefficient a is optimized to the one multiplied by VDD/(VDD+ΔV). As the result, the original signal is multiplied by VDD/(VDD+ΔV) in the multiplier 1, and the original gain is multiplied by (VDD+ΔV)VDD due to the fluctuations of the power supply voltage VDD in the D-class amplifier 3; thereby, the output signal in the state without the fluctuations of the power supply voltage VDD is attained.

[Function and Effect]

This embodiment, comparing the output signal from the low pass filter 6 with the reference signal from the low pass filter 9, according to the comparison result executes the feedback correction to increase or decrease the correction coefficient a multiplied to the original signal by the constant modifying breadth Δa, and thereby represses the influence by the fluctuations of the power supply voltage VDD. Therefore, only increasing or decreasing the correction coefficient a by the constant modifying breadth according to the comparison result of the comparator 10 will optimize the correction coefficient a so as to repress the influence by the fluctuations of the power supply voltage VDD; accordingly, the embodiment does not need such a complicated arithmetic operation as that of calculating a digital correction signal to be multiplied to the original signal, which makes it possible to delete a construction such as an analog/digital converter (ADC), etc., and to repress the influence by the fluctuations of the power supply voltage VDD with a simplified construction and inexpensive components.

Since the regulator voltage VDD/2 substantially immune to the fluctuations of the power supply voltage VDD is generated by use of the existing internal core regulator 4, a new regulator is unnecessary to be prepared, thus achieving a space saving.

Figure 2:
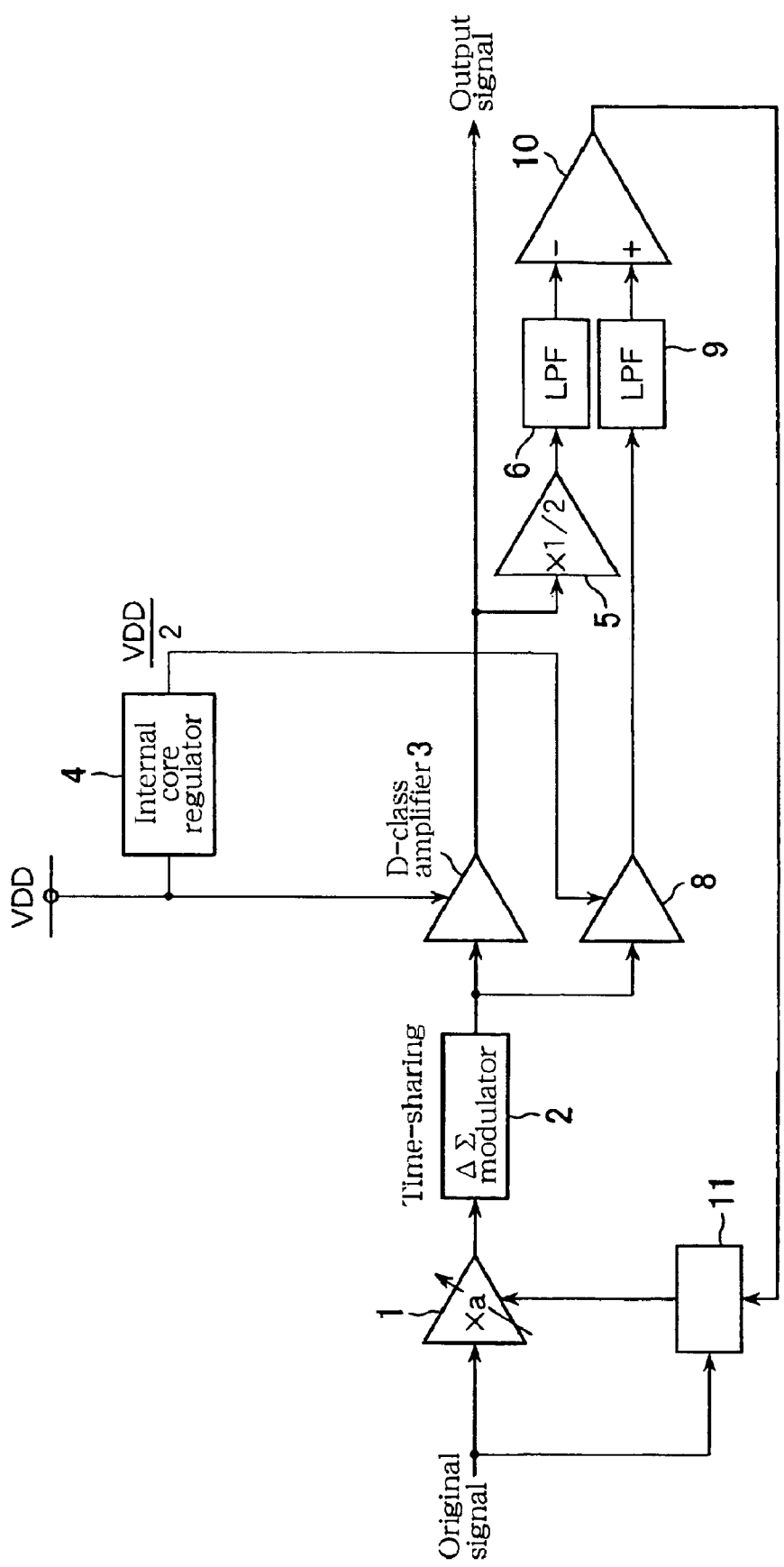

The above embodiment is provided with the reference delta-sigma modulator 7 for generating the reference signal individually separately. However, as shown in FIG. 2, instead of preparing the reference delta-sigma modulator 7, the delta-sigma modulator 2 may be used by the time sharing both for generating the input signal to the D-class amplifier 3 and for generating the reference signal. This case further simplifies the circuit construction to attain a further space saving.

(2) Second Embodiment

Figure 4:
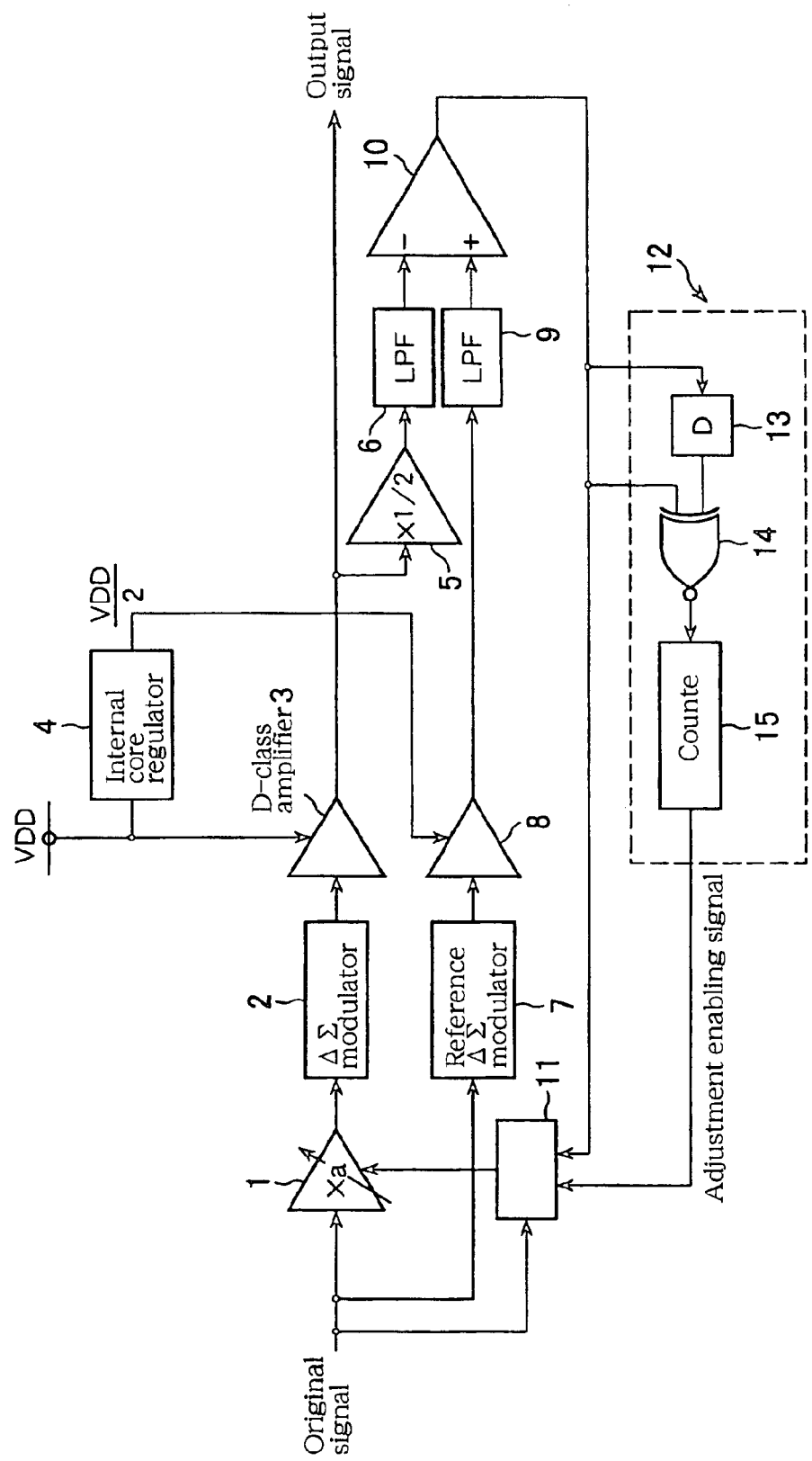
FIG. 4 illustrates a D-class signal amplification circuit relating to the second embodiment.

FIG. 4 illustrates a D-class signal amplification circuit relating to the second embodiment of the invention. The difference from the first embodiment is an addition of a correction timing adjustment circuit 12.

The correction timing adjustment circuit 12 includes a one-sample delay line 13, an exclusive NOR 14, and a counter 15. The one-sample delay line 13 retains an output before one sample (a previous output) from the comparator

10. The one-sample delay line 13 can be configured with, for example, a D-flip-flop that updates the output at the timing of the clock input falling. The exclusive NOR 14 compares the previous output from the comparator 10, inputted through the one-sample delay line 13, with the current output from the comparator 10; based on the comparison result, if both are equal, exclusive NOR 14 outputs High, and if both are different, it outputs Low. If the input from the exclusive NOR 14 is High, the counter 15 counts up, and when the counter value becomes a first predetermined frequency n1, the counter 15 outputs an adjustment-enabling signal High and resets the counter value. For example, assuming that the first predetermined frequency n1 is 5, when the comparator 10 outputs High, High, High, High, High, High in succession of 6 samples, the counter value becomes the first predetermined frequency n1=5, and the counter 15 outputs the adjustment-enabling signal High. If the input from the exclusive NOR 14 is Low, that is, if the continuing outputs from the exclusive NOR 14 are each different, the counter 15 resets the counter value to 0, and counts again from 1. And only when receiving the adjustment-enabling signal High, the coefficient control circuit 11 modifies the correction coefficient a based on the output from the comparator 10.

This embodiment is made capable of modifying the correction coefficient a, only when the outputs from the comparator 10 are equal in the succession of the first predetermined frequency n1. Thereby, when the output signal and the reference signal are substantially equal and the correction is not necessary, this embodiment halts the modification of the coefficient a. The comparator 10 can flap the output thereof due to the noises of the system surrounding the D-class signal amplification circuit, even in case the output signal and the reference signal are substantially equal and the correction is not necessary; and in such a case, to modify the correction coefficient a according to the output from the comparator 10 will produce a possibility of increasing the noises by the feedback control itself of the correction coefficient a. Accordingly, this embodiment prevents an increase of the noises by the correction, by permitting the modification of the correction coefficient a only when the outputs from the comparator 10 are equal in the succession of the first predetermined frequency n1 and halting the modification of the correction coefficient a when the correction is not necessary.

(3) Third Embodiment

Figure 5:
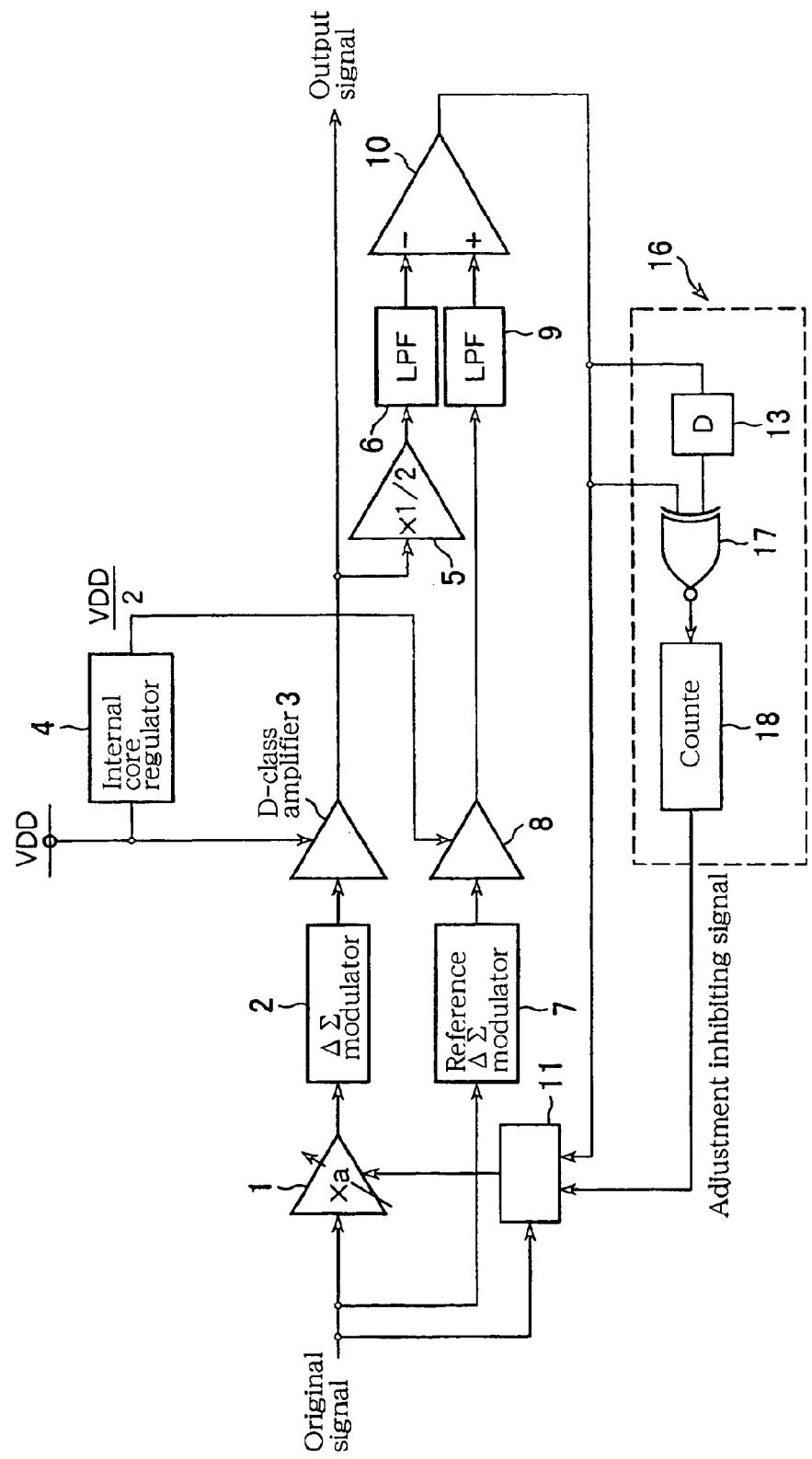
FIG. 5 illustrates a D-class signal amplification circuit relating to the third embodiment.

FIG. 5 illustrates a D-class signal amplification circuit relating to the third embodiment of the invention. The D-class signal amplification circuit relating to this embodiment includes a correction timing adjustment circuit 16 in replacement for the correction timing adjustment circuit 12 relating to the second embodiment. In the second embodiment, the counter counts the frequency in which the outputs from the comparator 10 are equal in succession, and outputs the adjustment-enabling signal High only when the outputs are equal in the succession of the first predetermined frequency n1. However in this embodiment, the counter counts the frequency in which the continuing outputs from the comparator 10 are each different, and outputs an adjustment inhibiting signal High, when the outputs are each different in the succession of a second predetermined frequency n2.

The correction timing adjustment circuit 16 includes a one-sample delay line 13, an exclusive OR 17, and a counter 18. The one-sample delay line 13 retains an output before one sample (a previous output) from the comparator 10. The exclusive OR 17 compares the output before one sample from the comparator 10 with the current output from the comparator 10; if both are coincident, exclusive NOR 14 outputs Low, and if both are different, it outputs High. The counter 18 increases the counter value by +1 each time it receives High, and when the counter value becomes the second predetermined frequency n2, the counter 18 outputs the adjustment inhibiting signal High, and resets the counter value.

For example, assuming that the second predetermined frequency n2 is 5, when the comparator 10 outputs High, Low, High, Low, High, Low in succession, the counter value becomes the second predetermined frequency n2=5, and the counter 18 outputs the adjustment inhibiting signal High and resets the counter value. Next, the counter 18 counts up the counter value from 1 with the normal sampling frequency regardless of the outputs from the comparator 10, and continuously outputs the adjustment inhibiting signal High until the counter value reaches a third predetermined frequency m. While the counter 18 continuously outputs High, the coefficient control circuit 11 inhibits the modification of the correction coefficient a. When the counter value reaches the third predetermined frequency m, the counter 18 resets the adjustment inhibiting signal to Low, resumes the modification of the correction coefficient a, and resets the counter value to 0. Thereafter, the counter 18 counts up again the counter value from 1, on the basis of the outputs from the comparator 10.

Upon receiving Low, the counter 18 resets the counter value to 0, and resumes counting from 1.

This embodiment executes the modification of the correction coefficient a, until the comparator outputs different values in the succession of the second predetermined frequency. When the continued outputs from the comparator 10 are each different by the second predetermined frequency, the counter 18 outputs the adjustment inhibiting signal High, which inhibits the modification of the correction coefficient a during a given time. After the passage of the given time, the embodiment, resetting the adjustment inhibiting signal to Low, again restarts the modification of the correction coefficient a.

In the same manner as the second embodiment, this embodiment prevents the noises by the ½ sampling frequency from occurring by a regular modification of the correction coefficient a by each sampling frequency, which modifies the correction coefficient a according to the unstable outputs from the comparator 10 even when the output signal and the reference signal are substantially equal. And, each time when the first predetermined frequency n1 is counted as the second embodiment, that is, compared to the case that executes the feedback control of the correction coefficient a by the cycle of substantially 1/n1 of the original sampling frequency, this embodiment corrects the coefficient a as long as the adjustment inhibiting signal High is not outputted; therefore, this embodiment is able to execute the feedback control of the correction coefficient a by substantially n1 times the sampling frequency to the second embodiment. Thereby, this embodiment is able to swiftly modify the correction coefficient a even when there is a sharp fluctuation of the power supply voltage VDD.

(4) Fourth Embodiment

FIG. 6 illustrates a D-class signal amplification circuit relating to the fourth embodiment of the invention. The D-class signal amplification circuit relating to this embodiment is provided with a coefficient adjustment circuit 19 in the signal amplification circuit relating to the first embodiment. The coefficient adjustment circuit 19 includes a one-sample delay line 13, an exclusive NOR 14, a counter 20, and adder-subtracter 21, and a coefficient register 22. The one-sample delay line 13 and the exclusive NOR 14 assume the same construction as those in the second embodiment, and the description thereof will be omitted.

The counter 20 counts up by +1, when the output from the exclusive NOR 14 is High (when the outputs from the comparator 10 are equal before one sample and this time), and counts down by −1, when the output from the exclusive NOR 14 is Low (when the outputs from the comparator 10 are different before one sample and this time). Here, the minimum counter value is specified as 1. The counter value of the counter 20 corresponds to the modifying breadth $\Delta$ of the coefficient a. Concretely, when the counter value is 1, 2, 3, ..., the modifying breadth $\Delta$ becomes $\Delta a$, $2\Delta a$, $3\Delta a$, ....

The adder-subtracter 21 adds the counter value of the counter 20 to a register value of the coefficient register 22, when the output state of the comparator 10 is High, and subtracts the counter value of the counter 20 from the register value of the coefficient register 22, when the output state of the comparator 10 is Low. The coefficient register 22 outputs the register value before one sample to the coefficient control circuit 11 and to the adder-subtracter 21, and stores the output from the adder-subtracter 21 as the register value. The coefficient control circuit 11 sets the correction coefficient a outputted from the coefficient register 22 to the multiplier 1, on the basis of the determination result as to whether the waveform level of the original signal is higher or lower than the waveform center, and the output from the comparator 10.

FIG. 7 illustrates an example of the modifying breadth of the correction coefficient a by the coefficient adjustment circuit 19. This example shows the case that the waveform level of the original signal is higher than the waveform center. As shown in the drawing, the coefficient adjustment circuit 19 increases the modifying breadth $\Delta$ by $\Delta a$ when the continuing outputs from the comparator 10 are equal, and decreases the modifying breadth $\Delta$ by $\Delta a$ when the continuing outputs from the comparator 10 are different. And, when the output from the comparator 10 is High (when the amplitude of the output signal is lower than the amplitude of the reference signal), the coefficient adjustment circuit 19 increases the correction coefficient a by the modifying breadth $n\Delta a$ determined by the counter value n; when the output from the comparator 10 is Low (when the amplitude of the output signal is higher than the amplitude of the reference signal), the coefficient adjustment circuit 19 decreases the correction coefficient a by the modifying breadth $n\Delta a$ determined by the counter value n. That is, when the outputs from the comparator 10 are equal in succession, the coefficient adjustment circuit 19 increases the modifying breadth $\Delta$ by $\Delta a$ to adjust the modifying breadth $\Delta$ of the correction coefficient a at each sampling. Thereby, when the power supply voltage VDD fluctuates sharply, the coefficient adjustment circuit 19 increases the modifying breadth $\Delta$ to swiftly increase the correction coefficient a, thus swiftly adjusting the output signal. On the other hand, when the output from the comparator 10 is different from that before one sample, the coefficient adjustment circuit 19 decreases the modifying breadth $\Delta$ by $\Delta a$ to decrease the modifying breadth $\Delta$ of the correction coefficient a in the multiplier 1. Thereby, when the power supply voltage VDD fluctuates gently and minutely, the coefficient adjustment circuit 19 is able to adjust the output signal with a high precision.

When the modifying breadth A of the correction coefficient a is the constant value $\Delta a$, and if the modifying breadth $\Delta a$ is too small, the correction cannot follow when the fluctuation magnitude of the power supply voltage VDD is large. On the other hand, if the modifying breadth $\Delta a$ is too large, there is a possibility that correction can increase the noises when the fluctuation magnitude of the power supply voltage VDD is minute or null. In contrast to this, when the state of the output signal being higher than the reference signal is continuous, or when the state of the output signal being lower than the reference signal is continuous, this embodiment enhances the follow-up capability by setting the modifying breadth $\Delta$ larger; and in reverse, when the relation of magnitudes of the output signal and the reference signal is inverted, since the fluctuation magnitude of the power supply voltage VDD is minute or null, this embodiment prevents the noises by the correction by decreasing the modifying breadth $\Delta$.

(5) Fifth Embodiment

Figure 8:
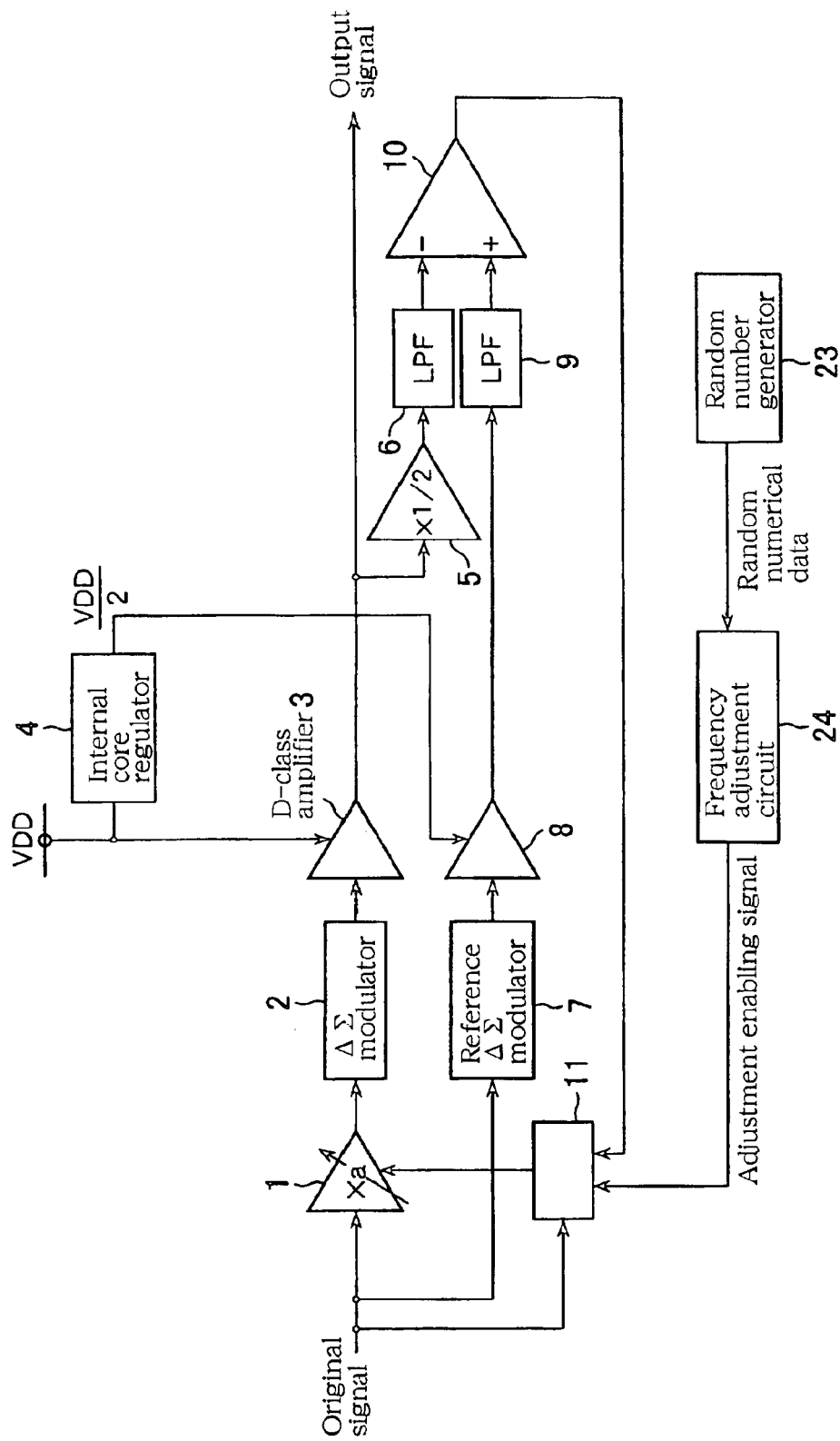
FIG. 8 illustrates a D-class signal amplification circuit relating to the fifth embodiment.

FIG. 8 illustrates a D-class signal amplification circuit relating to the fifth embodiment of the invention. The D-class signal amplification circuit relating to this embodiment is additionally provided with a random number generator 23 as a frequency generation circuit and a frequency adjustment circuit 24, in the signal amplification circuit relating to the first embodiment. The random number generator 23 outputs random numerical data (random number data) in answer to the data request from the frequency adjustment circuit 24. The frequency adjustment circuit 24 outputs the adjustment-enabling signal High at a random timing determined on the basis of the random number data. And, the coefficient control circuit 11 modifies the correction coefficient a according to the adjustment-enabling signal given at the random timing.

When the power supply voltage VDD does not fluctuate, and the output signal and the reference signal are equal, the correction is intrinsically unnecessary. In such circumstances, to execute the correction through a regular modification of the correction coefficient a by each cycles of the sampling frequency will easily produce the ½fs noises of the sampling frequency. In contrast to this, this embodiment randomly outputs the adjustment-enabling signal High, and randomly varies a correction sampling frequency being the timing of modifying the correction coefficient a. Thereby, this embodiment disperses the noises dependent on the correction sampling frequency to wider frequencies, thus reducing the noises.

(6) Sixth Embodiment

Figure 9:
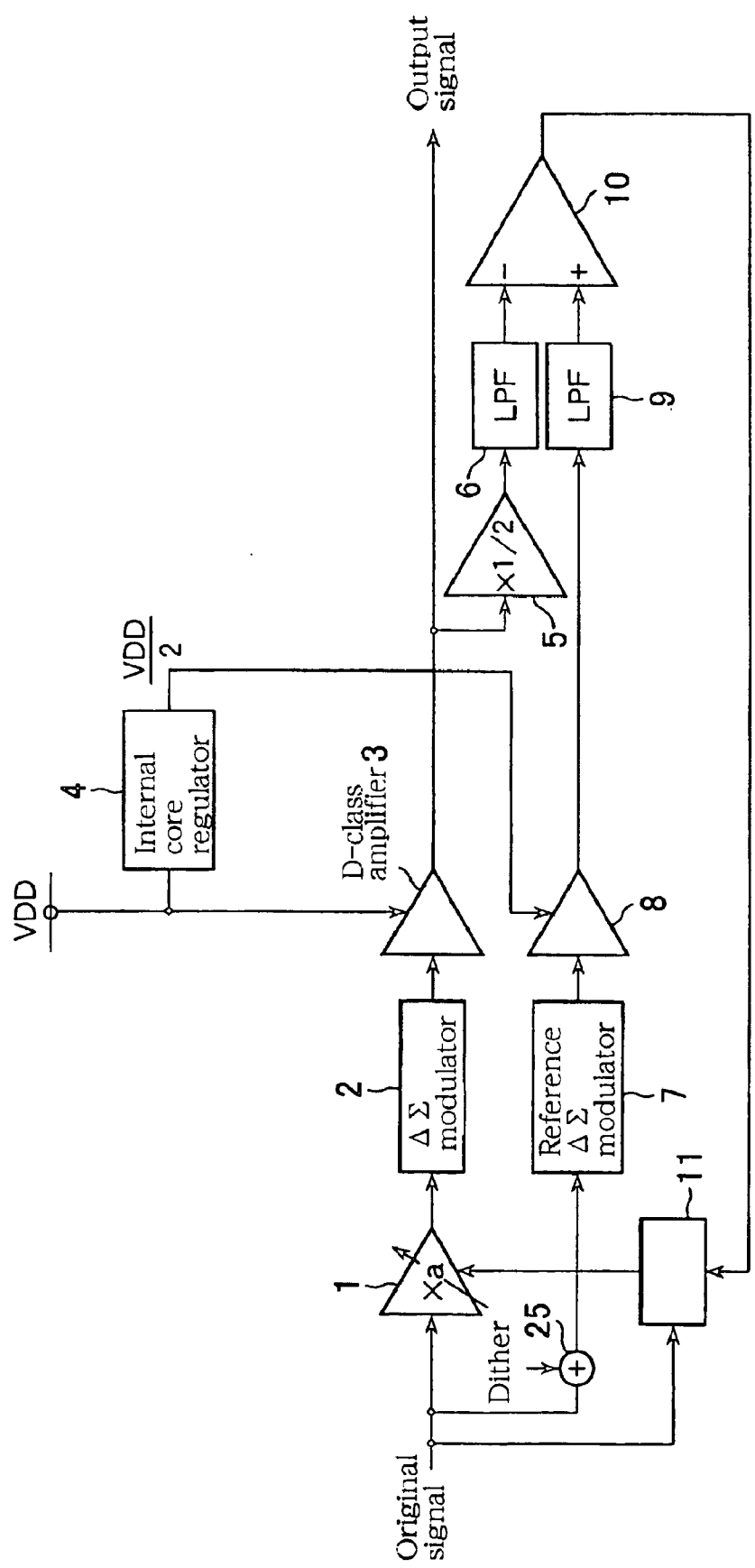
FIG. 9 illustrates a D-class signal amplification circuit relating to the sixth embodiment.

FIG. 9 illustrates a D-class signal amplification circuit relating to the sixth embodiment. This embodiment processes the original signal by means of the dithering in replacement for randomly outputting the adjustment-enabling signal. A dithering adder 25 adds a minute random signal (white noise) to the original signal. In the general digital processing, to add a white noise to a signal will disperse a quantization noise having a dependency on a signal frequency, which is apt to be unevenly distributed to a specified frequency, to wider frequencies, and whiten the quantization noise. The dithering adder 25 adding a white noise to the original signal in advance, this embodiment is able to disperse a quantization noise dependent on the correction sampling frequency to wider frequencies and whiten the quantization noise, in the same manner as the fifth embodiment.

(7) Seventh Embodiment

Figure 10:
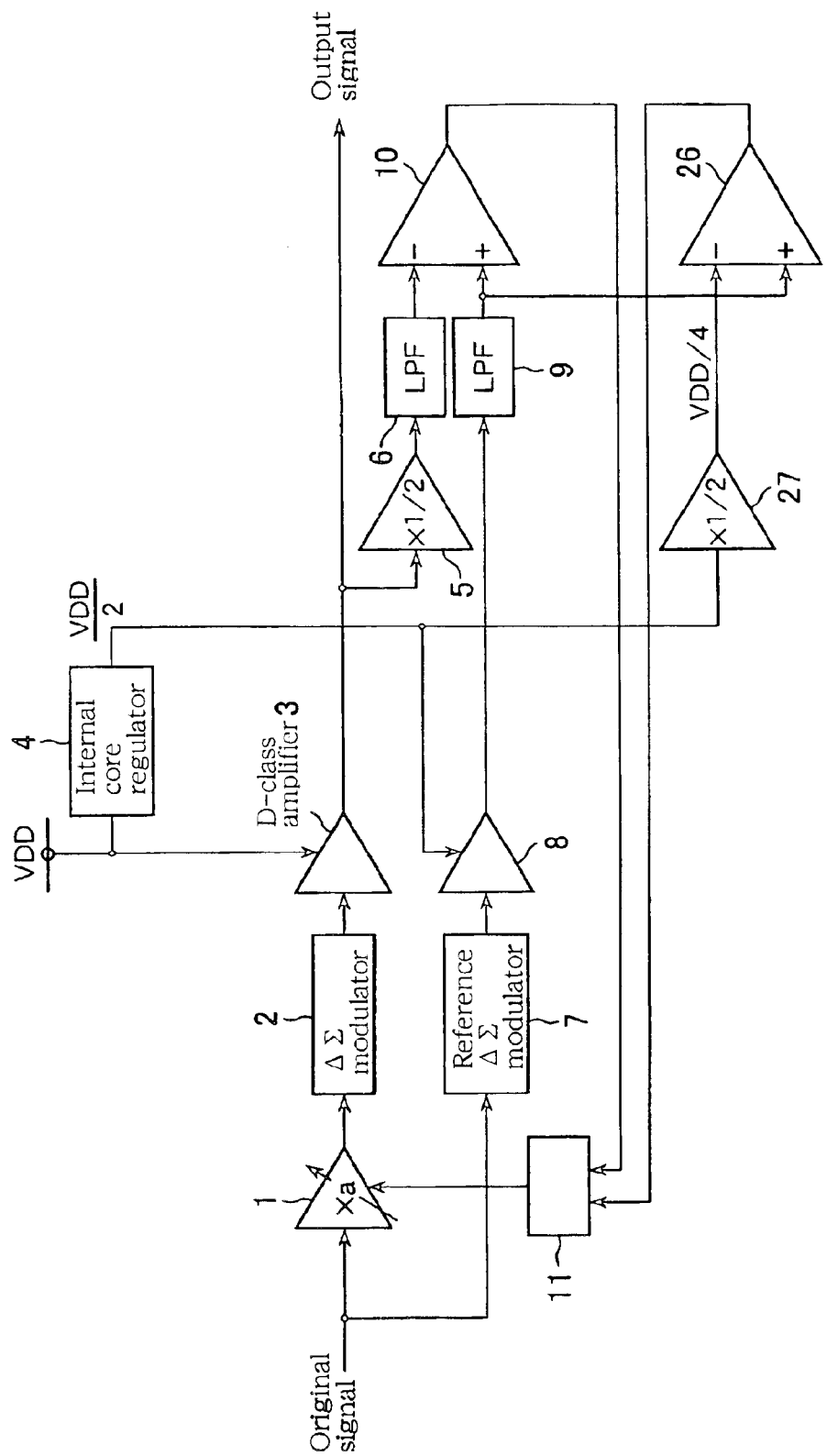
FIG. 10 illustrates a D-class signal amplification circuit relating to the seventh embodiment.
Figure 11:
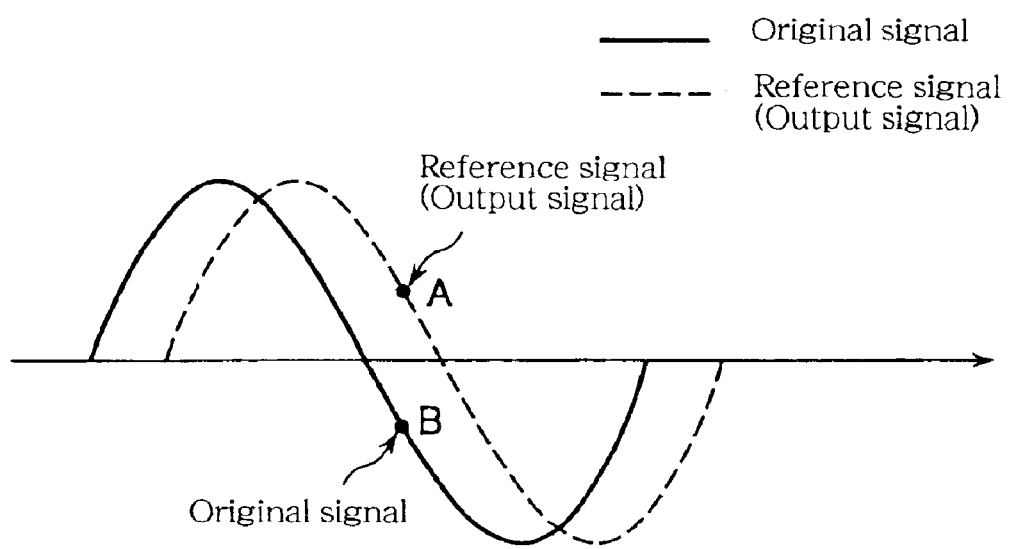
FIG. 11 illustrates a phase difference between an original signal and a reference signal.

FIG. 10 illustrates a D-class signal amplification circuit relating to the seventh embodiment. The above embodiments determine whether the waveform level of the original signal is higher or lower than the waveform center; however, this embodiment determines whether the waveform level of the reference signal is higher or lower than the waveform center, by comparing a waveform center voltage VDD/4 generated by a multiplier 27 dividing the regular voltage VDD/2 into ½ with the reference signal. The original signal will produce a phase delay in the passage of the delta-sigma modulator 2 and 7 and thereafter, especially the LPF 6 and 9. If there is a phase difference as shown in FIG. 11, the determination as to whether the waveform level is higher or lower than the waveform center will differ in regard to the original signal and the reference signal. At B point in the drawing, for example, the waveform level of the original signal is lower than the waveform center, and at A point at the same moment, the waveform level of the reference signal is higher than the waveform center. As described in the first embodiment, even if the outputs from the comparator 10 are the same, the direction of increasing or decreasing the correction coefficient a differs according to the determination whether the waveform level is higher or lower than the waveform center; therefore, if the determination whether the waveform level is higher or lower than the waveform center differs as shown by B point and A point in FIG. 11, the direction of increasing or decreasing the correction coefficient a will be reversed, which leads to a possibility of amplifying the influence by the fluctuations of the power supply voltage VDD.

Accordingly, this embodiment determines whether the waveform level of the reference signal after passing the LPF 9 is higher or lower than the waveform center. Concretely, a comparator 26 is provided separately from the comparator 10, the reference signal after passing the LPF 9 and the waveform center voltage VDD/4 are inputted to the comparator 26, and the comparator 26 determines whether the waveform level of the reference signal is higher or lower than the waveform center. The comparator 26 outputs High when the reference signal is higher than the waveform center, and outputs Low when the reference signal is lower than the waveform center. To determine whether the waveform level is higher or lower than the waveform center in phase with the reference signal will prevent the determination as to whether the waveform level is higher or lower than the waveform center from being reversed, and will prevent increasing the noises reversely by the correction.

Figure 12:
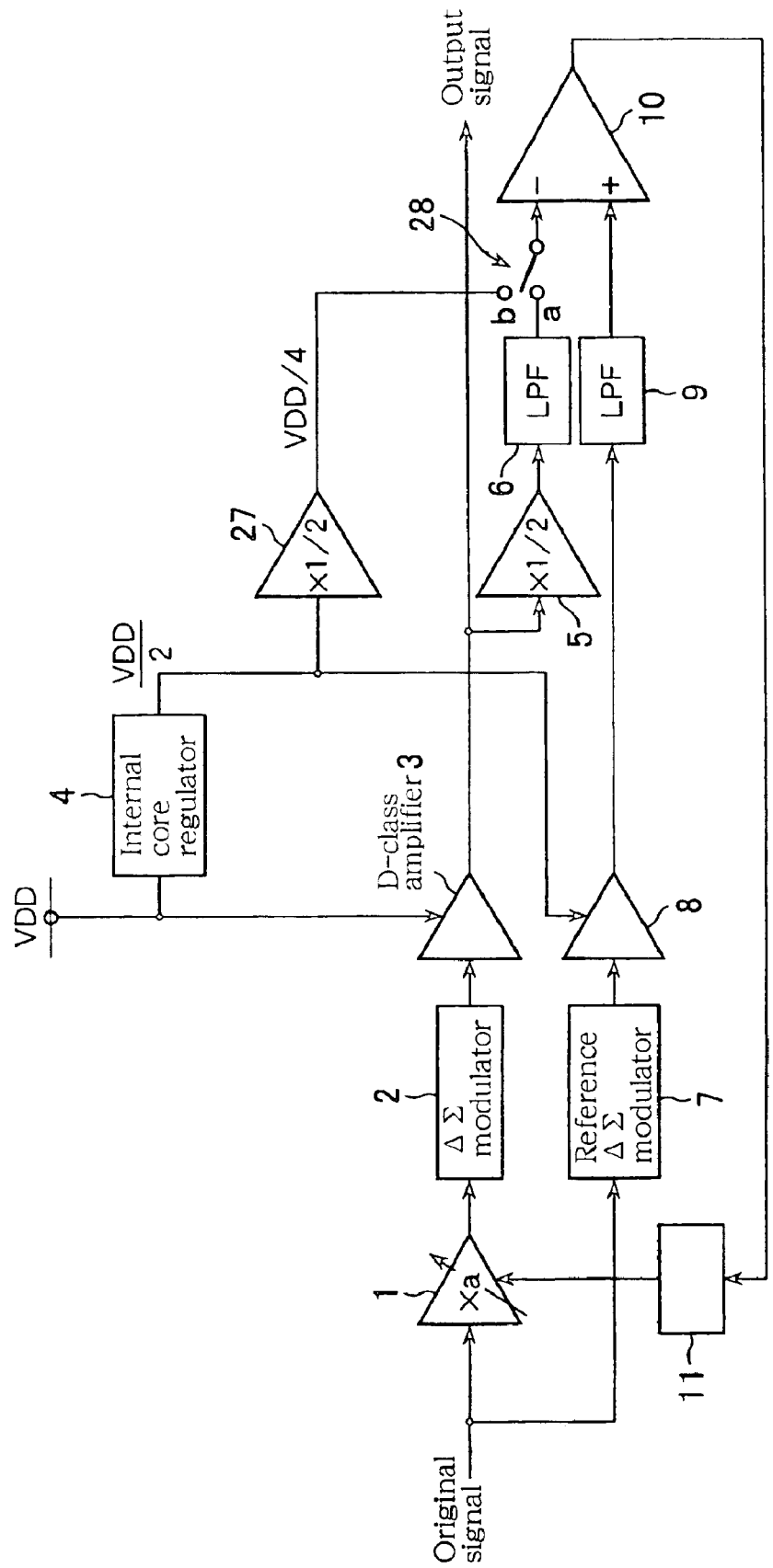

This example prepares the comparator 26 separately from the comparator 10. However, as shown in FIG. 12, this embodiment may use the comparator 10 by the time sharing both for the comparison as to the magnitude of the waveform levels of the output signal and the reference signal and the determination as to whether the waveform level is higher or lower than the waveform center. Concretely, a switch 28 is connected to the negative phase input terminal of the comparator 10, and the switch 28 switches the negative phase input into the reference signal or the waveform center voltage VDD/4. That is, the following switching operation is to be performed by the time sharing: when comparing the magnitude of the waveform levels of the output signal and the reference signal, the switch 28 turns the contact into a, and when determining whether the waveform level is higher or lower than the waveform center, the switch 28 turns the contact into b. With this construction adopted, it is not necessary to separately prepare the comparator 26, and the circuit construction can be simplified.

(8) Other Embodiments

Figure 13:
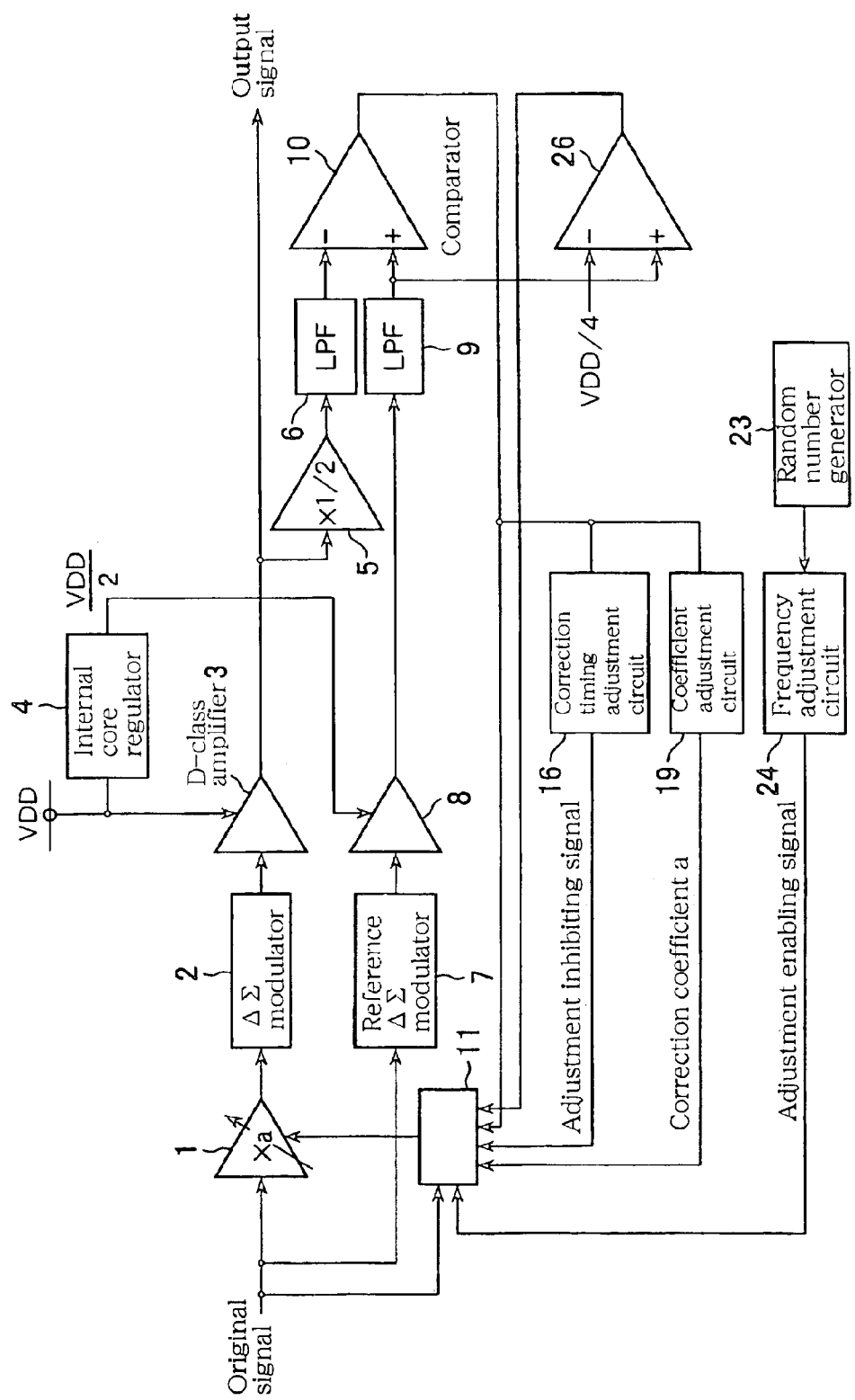
FIG. 13 illustrates an example in which the D-class signal amplification circuits of the embodiments are combined.

To appropriately combine two or more of the first embodiment through the seventh embodiment will achieve the functions and effects described in these embodiments. For example, FIG. 13 illustrates a signal amplification circuit, in which the correction timing adjustment circuit 16 relating to the third embodiment, the coefficient adjustment circuit 19 relating to the fourth embodiment, the random number generator 23 and the frequency adjustment circuit 24 relating to the fifth embodiment, and the comparator 26 relating to the seventh embodiment are combined with the circuit construction relating to the first embodiment. In this example, the correction timing adjustment circuit 16 inhibits the correction when the output signal and the reference signal are approximate, and the coefficient adjustment circuit 19 enhances the follow-up capability when the power supply voltage fluctuates greatly, and restrains the generation of noises by decreasing the modifying breadth of the correction coefficient when the power supply voltage fluctuates minutely. And, the random number generator 23 and the frequency adjustment circuit 24 reduce the quantization noise dependent on the correction sampling frequency. Further, the comparator 26 determines whether the waveform level of the reference signal is higher or lower than the waveform center to thereby prevent the determination result from being reversed because of a phase difference between the original signal and the output signal.

What is claimed is:

1. A D-class signal amplification circuit supplied with a first power supply voltage, which amplifies an input signal inputted to an input node and outputs an output signal to an output node, comprising:
    a multiplier that multiplies the input signal by a correction coefficient;
    a first modulator that executes a delta-sigma modulation to an output signal from the multiplier;
    a D-class amplifier supplied with the first power supply voltage, which amplifies an output signal from the first modulator to output the output signal to the output node;
    a voltage conversion circuit that generates a second power supply voltage lower than the first power supply voltage, retained at a constant level from the first power supply voltage;
    a first low pass filter that inputs a signal converted into a level of the second power supply voltage on the basis of the output signal outputted from the D-class amplifier;
    a reference signal generation circuit supplied with the second power supply voltage, which generates a reference signal for comparing a signal outputted from the first low pass filter on the basis of the input signal;
    a second low pass filter that inputs the reference signal;
    a first comparator that compares a level of the signal outputted from the first low pass filter with a level of the signal outputted from the second low pass filter; and
    a coefficient control circuit that increases or decreases the correction coefficient being multiplied by the multiplier by a predetermined modifying breadth, on the basis of a comparison result of the first comparator.

2. A D-class signal amplification circuit as claimed in claim 1, wherein the coefficient control circuit controls to increase or decrease the correction coefficient, when the comparison results are repeatedly different.

3. A D-class signal amplification circuit as claimed in claim 2, wherein the coefficient control circuit increases or decreases the correction coefficient, when the comparison results are equal in succession by a first predetermined frequency.

4. A D-class signal amplification circuit as claimed in claim 2, wherein the coefficient control circuit inhibits to increase or decrease the correction coefficient, when the comparison results are different in succession by a second predetermined frequency.

5. A D-class signal amplification circuit as claimed in claim 1, wherein the coefficient control circuit increases the modifying breadth of the correction coefficient, when the comparison results are equal at the previous time and this time, and decreases the modifying breadth of the correction coefficient, when the comparison results are different at the previous time and this time.

6. A D-class signal amplification circuit as claimed in claim 5, further comprising:

a modifying breadth determination circuit that determines the modifying breadth of the correction coefficient by counting up when the comparison results are equal at the previous time and this time, and by counting down when the comparison results are different at the previous time and this time, and a coefficient determination circuit that stores a previous counter value by the counter circuit, adds according to the comparison result a current counter value to the previous counter value when the output signal after converted into a level of the second power supply voltage is lower than the reference signal, and subtracts the current counter value from the previous counter value when the output signal after converted into a level of the second power supply voltage is higher than the reference signal, wherein:

the coefficient control circuit sets the correction coefficient determined by the coefficient determination circuit to the multiplier.

7. A D-class signal amplification circuit as claimed in claim 1, further comprising a frequency generation circuit that generates a random frequency, wherein the coefficient control circuit increases or decreases the correction coefficient at a timing of the random frequency.

8. A D-class signal amplification circuit as claimed in claim 1, further comprising a dithering adder that adds a white noise to the input signal to output the result to the reference signal generation circuit.

9. A D-class signal amplification circuit as claimed in claim 1, further comprising a switch circuit that inputs the output signal converted into a level of the second power supply voltage and a waveform center voltage being half the second power supply voltage selectively by the time sharing to the first comparator, wherein:

the first comparator accepts an input from the switch circuit and an input of the reference signal, compares the output signal converted into a level of the second power supply voltage with the reference signal to thereby output the comparison result, and compares the waveform center voltage with the reference signal to thereby output a determination result whether the waveform level of the reference signal is higher or lower than a waveform center; and the coefficient control circuit increases or decreases the correction coefficient on the basis of the comparison result and the determination result whether the waveform level is higher or lower than the waveform center.

10. A D-class signal amplification circuit as claimed in claim 1, further comprising a second comparator that compares the reference signal with a waveform center voltage being half the second power supply voltage to thereby determine whether the waveform level of the reference signal is higher or lower than the waveform center, wherein:

the coefficient control circuit increases or decreases the correction coefficient, on the basis of a comparison result by the first comparator and a determination result by the second comparator.

11. A D-class signal amplification circuit as claimed in claim 1, wherein:

the D-class signal amplification circuit is contained in a semiconductor integrated circuit, and the voltage conversion circuit is an internal core regulator of the semiconductor integrated circuit.

12. A D-class signal amplification circuit as claimed in claim 1, wherein the reference signal generation circuit includes:

a second modulator that executes the delta-sigma modulation to an input signal inputted to the input node, and a buffer supplied with the second power supply voltage, which converts an output signal from the second modulator to output the reference signal to the second low pass filter.

13. A D-class signal amplification circuit as claimed in claim 12, wherein the first and the second modulatord are formed into an integrated unit, which accepts the output signal from the multiplier and the input signal inputted to the input node selectively by the time sharing, executes the delta-sigma modulation to the output signal from the multiplier to output to the D-class amplifier, and executes the delta-sigma modulation to the input signal inputted to the input node to output to the buffer.

* * * * *